US008812976B2

(12) United States Patent
Kollin et al.

(10) Patent No.: US 8,812,976 B2
(45) Date of Patent: Aug. 19, 2014

(54) PROGRAMMABLE EQUIPMENT CONFIGURATION METHOD AND APPARATUS

(75) Inventors: Adam Kollin, Troy, MI (US); John Keem, Bloomfield Hills, MI (US); Steffen Porthun, Teltow (DE)

(73) Assignee: RHK Technology, Inc., Troy, MI (US)

( * ) Notice: Subject to any disclaimer, the term of this patent is extended or adjusted under 35 U.S.C. 154(b) by 0 days.

(21) Appl. No.: 13/256,809

(22) PCT Filed: Mar. 16, 2010

(86) PCT No.: PCT/US2010/027553
§ 371 (c)(1),
(2), (4) Date: Sep. 15, 2011

(87) PCT Pub. No.: WO2010/107848
PCT Pub. Date: Sep. 23, 2010

(65) Prior Publication Data
US 2012/0005621 A1    Jan. 5, 2012

Related U.S. Application Data

(60) Provisional application No. 61/160,652, filed on Mar. 16, 2009, provisional application No. 61/160,959, filed on Mar. 17, 2009, provisional application No. 61/259,882, filed on Nov. 10, 2009.

(51) Int. Cl.
*G06F 3/048* (2013.01)
*G06F 15/177* (2006.01)

(52) U.S. Cl.
USPC ........... 715/781; 715/735; 715/763; 715/764; 715/771; 715/964

(58) Field of Classification Search
CPC ....... G06F 3/0481; G06F 9/4443; G09G 5/14; G09G 2340/02; G09G 2340/12
USPC ........................................................ 715/781
See application file for complete search history.

(56) References Cited

U.S. PATENT DOCUMENTS 5,301,336 A      4/1994  Kodosky et al.
5,644,728 A  *   7/1997  Pillans ........................... 705/43

(Continued)

FOREIGN PATENT DOCUMENTS

JP    60-043777 A    3/1985
JP    06-125067 A    5/1994

(Continued)

OTHER PUBLICATIONS

PCT International Search Report and Written Opinion, International Application No. PCT/US2010/027553, International Filing Date: Mar. 16, 2010, 8 pages.

(Continued)

*Primary Examiner* — Doon Chow
*Assistant Examiner* — Shourjo Dasgupta
(74) *Attorney, Agent, or Firm* — Reising Ethington P.C.

(57) ABSTRACT

A computer-implemented method, system, and computer readable medium for configuring programmable equipment having hardware devices that can be programmatically interconnected into different hardware configurations. A graphical user interface is provided on a computer display which permits a user to iconically define both a hardware and procedural configuration of the available hardware devices. Configuration data is generated that can be used to automatically configure the programmable equipment according to the user-defined hardware and procedural configuration.

20 Claims, 13 Drawing Sheets

(56) References Cited

U.S. PATENT DOCUMENTS

| | | |
|---|---|---|
| 6,462,760 B1 | 10/2002 | Cox, Jr. et al. |
| 6,966,039 B1* | 11/2005 | Bartz et al. .................... 716/121 |
| 7,143,361 B2 | 11/2006 | Ramchandani |
| D533,182 S | 12/2006 | McDougall et al. |
| D535,301 S | 1/2007 | Frey et al. |
| 7,177,786 B2 | 2/2007 | Kodosky et al. |
| 7,234,342 B2 | 6/2007 | Proksch et al. |
| D570,359 S | 6/2008 | Sriver |
| D576,174 S | 9/2008 | Ording et al. |
| D579,020 S | 10/2008 | Aliaga |
| D586,820 S | 2/2009 | Makoski et al. |
| D590,414 S | 4/2009 | Bhat et al. |
| 7,543,281 B2 | 6/2009 | King et al. |
| 2003/0193025 A1* | 10/2003 | Takagi ......................... 250/310 |
| 2005/0050156 A1 | 3/2005 | Suzuki et al. |
| 2005/0050474 A1 | 3/2005 | Bells et al. |
| 2006/0095893 A1 | 5/2006 | Vahid et al. |
| 2007/0179641 A1* | 8/2007 | Lucas et al. ..................... 700/83 |
| 2007/0240069 A1 | 10/2007 | Eldridge et al. |
| 2007/0261021 A1* | 11/2007 | Aberg ........................... 717/105 |
| 2008/0082418 A1* | 4/2008 | Fordyce et al. ................. 705/14 |
| 2009/0049424 A1 | 2/2009 | Kumar et al. |

FOREIGN PATENT DOCUMENTS

| | | | |
|---|---|---|---|
| JP | 2003288458 A | 10/2003 | |
| JP | 2004094432 A | 3/2004 | |
| WO | WO 2007/061652 A2 | 5/2007 | |

OTHER PUBLICATIONS

Hanna, Darrin M. et al., Flowpaths: Compiling Stack-Based IR to Hardware, CSE Dept. Oakland University, Rochester, Michigan, May 5, 2006, 12 pages.

Hanna, Darrin M. et al., A Compiler to Generate Hardware from Java Byte Codes for High Performance, Low Energy Embedded Systems, School of Engineering and Computer Science, Oakland University, Rochester, Michigan, Jun. 7, 2007, 10 pages.

Abramovitch, Daniel Y. et al., A Tutorial on the Mechanisms, Dynamics, and Control of Atomic Force Microscopes, 2007 American Control Conference, New York, City, Jul. 11-13, 2007, pp. 3488-3502.

Nanonis, Spin Valves Investigated with Bemm—A Case for Nanonis's Programming Interface, Nanonis GmbH, Zurich, Switzerland, www.nanonis.com, 1 page.

Nanonis, Nanonis Programming Interface, Nanonis GmbH, Zurich, Switzerland, 2 pages.

Andraka, Ray, A Survey of CORDIC algorithms for FPGA Based Computers, Andraka Consulting Group, Inc., North Kingstown, Rhode Island, 10 pages.

* cited by examiner

*Figure 8*

CV = cv(tn), cv(HardwareConnections), cv(ParameterSettings), cv(ExcitationChannels), cv(ResponseChannels), cv(Boolean(W(tn),G(tn)))

| cv(tn) | cv(HardwareC onnections) | cv(Parameter Settings) | cv(ExcitationCh annels) | cv(Response Channels) | cv(Boolean) |
|---|---|---|---|---|---|
| tn | (i=1to10) | (j=1 to 7) | E3,E6,E9 | R2,R4,R7 | [W(tn)] | note    [W(tn)] are changed programatically according to the actions chosen

|  | cv(Excitations a 3 dimensional vector) | | | cv(responses a 3 dimensional vector) | | | cv(Boolean a 6 dimensional vector) | | | | | |
|---|---|---|---|---|---|---|---|---|---|---|---|---|
| cv(tn) | E3 | E6 | E9 | R2 | R4 | R7 | start | stop | state | loop | activate TimeStep | activate Frequency change |
| 0 | 0 | 0 | 0 | 0 | 0 | 0 | 1 | 0 | 0 | 0 | 0 | 0 |
| 1 | 0 | 0 | 0 | 0 | 0 | 0 | 1 | 0 | 1 | 0 | 0 | 0 |
| 2 | 0 | 0 | 0 | 0 | 0 | 0 | 1 | 0 | 1 | 1 | 0 | 0 |
| 3 | 0 | 0 | 0 | 0 | 0 | 0 | 1 | 0 | 1 | 1 | 1 | 0 |
| 4 | a2 | 0 | 0 | 0 | 0 | 0 | 1 | 0 | 1 | 999 | 1 | 0 |
| (...) | a2 | 0 | 0 | a2 | 0 | 0 | (...) | (...) | (...) | (...) | (...) | (...) |
| 1002 | a2 | a2+a3,f3 | f(a2+a3,f3) | a2 | a2+a3,f3 | f(a2+a3,f3) | 1 | 0 | 1 | 1 | 1 | 0 |
| 1003 | a2 | a2+a3,f3+b | f(a2+a3,f3+b) | a2 | a2+a3,f3+b | f(a2+a3,f3+b) | 1 | 0 | 1 | 0 | 0 | 1 |
| 1004 | a2 | a2+a3,f3+b | f(a2+a3,f3+b) | a2 | a2+a3,f3+b | f(a2+a3,f3+b) | 0 | 1 | 0 | 0 | 0 | 0 |

*Figure 9*

```xml
<HardwareSpace Id="0" ModelName="WorkBench" palettename="defaultpalette" guid="{D85D7209-0B59-4438-8624-D6749427B985}" Detached="0" Left="0" Top="0" Width="845" Height="279">
    <Items>
        <Item TypeID="2" TypeName="Bias Control" Id="60" X="8" Y="162">
            <Properties>
                <Property Name="Name" Id="1" Type="Value" Value="Bias Offset Control"/>
                <Property Name="Amplitude" Id="100" Type="Value" Value="1.000e+0"/>
            </Properties>
        </Item>
        <Item TypeID="3" TypeName="Signal Generator" Id="32" X="328" Y="169">
            <Properties>
                <Property Name="Name" Id="1" Type="Value" Value="Bias Offset Control"/>
                <Property Name="Frequency" Id="100" Type="Value" Value="1.000e+0"/>
                <Property Name="Amplitude" Id="101" Type="Value" Value="1.000e+0"/>
            </Properties>
        </Item>
        <Item TypeID="5" TypeName="Filter" Id="55" X="328" Y="169">
            <Properties>
                <Property Name="Name" Id="1" Type="Value" Value="Filter"/>
                <Property Name="Filter Cut off frequency" Id="101" Type="Value" Value="0"/>
            </Properties>
        </Item>
        <Item TypeID="7" TypeName="Oscilloscope" Id="53" X="465" Y="197">
            <Properties>
                <Property Name="Name" Id="1" Type="Value" Value="Oscilloscope"/>
                <Property Name="Time/Div" Id="100" Type="Value" Value="0"/>
            </Properties>
        </Item>
    </Items>

<Connectors>
        <Connector StartItem-Id="60" StartPin-Id="2" EndItem-Id="32" EndPin-Id="3"/>
        <Connector StartItem-Id="32" StartPin-Id="4" EndItem-Id="55" EndPin-Id="6"/>
        <Connector StartItem-Id="55" StartPin-Id="7" EndItem-Id="71" EndPin-Id="9"/>
    </Connectors>
</HardwareSpace>
```

*Figure 10*

```xml
<ActionSpace Id="1" ModelName="Bias Modulation Procedure" palettename="defaultpalette" guid="{08DF1B8D-A263-42A2-B3D2-84FCD347A064}" Detached="0" Left="0" Top="0" Width="1071" Height="866">
    <Items>
        <Item Width="224" Height="159" TypeID="3583" TypeName="State" Id="1" X="150" Y="258">
            <Items>
                <Item Width="180" Height="134" TypeID="3659" TypeName="Loop" Id="2" X="160" Y="263">
                    <Items>
                        <Item TypeID="3607" TypeName="Activate" Id="3" X="198" Y="276">
                            <Properties>
                                <Property Name="Name" Id="1" Type="Value" Value="Frequency (f3)"/>
                            </Properties>
                            <HwItem Id="32" Type="8423">
                                <Properties>
                                    <Property Name="Frequency Offset Input" Id="100" Type="Value" Value="1.20e+001"/>
                                </Properties>
                            </HwItem>
                        </Item>
                    </Items>
                    <Properties>
                        <Property Name="Name" Id="1" Type="Value" Value="W(tn) Loop"/>
                        <Property Name="Loop Count" Id="100" Type="Value" Value="1000"/>
                    </Properties>
                </Item>
            </Items>
            <Properties>
                <Property Name="Name" Id="1" Type="Value" Value="W State"/>
            </Properties>
        </Item>
        <Item TypeID="3617" TypeName="Stop" Id="12" X="650" Y="364">
            <Properties>
                <Property Name="Name" Id="1" Type="Value" Value="Stop"/>
            </Properties>
        </Item>
        <Item TypeID="3593" TypeName="Start" Id="24" X="17" Y="163">
            <Properties>
                <Property Name="Name" Id="1" Type="Value" Value="Start"/>
            </Properties>
        </Item>
    </Items>
    <Connectors>
        <Connector StartItem-Id="1" StartPin-Id="2" EndItem-Id="14" EndPin-Id="0"/>
        <Connector StartItem-Id="14" StartPin-Id="2" EndItem-Id="12" EndPin-Id="0"/>
        <Connector StartItem-Id="24" StartPin-Id="0" EndItem-Id="1" EndPin-Id="0"/>
    </Connectors>
</ActionSpace>
```

*Figure 11*

```xml
<?xml version="1.0" ?>
<Workspace>
<Workbench>
<PaletteGroup Name="General">
<PaletteItem Name="Bias Control" ID="2" DisplayName="Bias Control" Description="MY Des" Icon="counter">
<PaletteItem Name="Signal Generator" ID="3" DisplayName="Signal Generator" Description="MY Des" Icon="counter">
<InputPins>
<Pin Name="Input" ID="3" Description="Input Pin" PinType="1" TypeID="2" X="-1" Y="-1">
<Parameters />
</Pin>
</InputPins>
<OutputPins>
<Pin Name="Count" ID="4" Description="Output Pin" PinType="1" TypeID="2" X="-1" Y="-1">
<Parameters />
</Pin>
</OutputPins>
<Parameters>
<Parameter Name="Name" DataType="string" ID="1" ParameterType="String" DisplayLocation="4" DefaultValue="Counter" />
<Parameter Name="Description" DataType="string" ID="2" ParameterType="Text" DisplayLocation="4" DefaultValue="" />
<Parameter Name="Show in Dashboard" DataType="bool" ID="3" ParameterType="Check" DisplayLocation="4" DefaultValue="true" />
</Parameters>
</PaletteItem>
<PaletteItem Name="Filter" ID="5" DisplayName="Filter" Description="MY Des" Icon="counter">
<PaletteItem Name="Oscilloscope" ID="7" DisplayName="Oscilloscope" Description="MY Des" Icon="counter">
<PaletteItem Name="Counter" ID="7937" DisplayName="Counter" Description="MY Des" Icon="counter">
```

*Figure 12*

```xml
<ValidationRule>
    <Item Type ="2" Name="Bias Controller">
        <Pin Type="2" Name="Bias Output">
            <ConnectablePin>
                <Pin Type="3" Name="Offset Input" Item-Type="3" Item-Name="Signal Generator"/>
                <Pin Type="9" Name="Input" Item-Type="7" Item-Name="Oscilloscope"/>
            </ConnectablePin>
        </Pin>
    </Item>
    <Item Type ="3" Name="Signal Generator">
        <Pin Type="4" Name="Output">
            <ConnectablePin>
                <Pin Type="6" Name="Input" Item-Type="5" Item-Name="Filter"/>
                <Pin Type="9" Name="Input" Item-Type="7" Item-Name="Oscilloscope"/>
            </ConnectablePin>
        </Pin>
    </Item>
    <Item Type ="5" Name="Filter">
        <Pin Type="7" Name="Output">
            <ConnectablePin>
                <Pin Type="9" Name="Input" Item-Type="7" Item-Name="Oscilloscope"/>
            </ConnectablePin>
        </Pin>
    </Item>
</ValidationRule>
```

*Figure 13*

PROGRAMMABLE EQUIPMENT CONFIGURATION METHOD AND APPARATUS

PRIORITY

The present application claims priority from PCT Patent Application PCT/US2010/027553 filed on Mar. 16, 2010, U.S. Provisional Patent Application 61/259,882 filed on Nov. 10, 2009, U.S. Provisional Patent Application 61/160,959 filed on Mar. 17, 2009, and U.S. Provisional Patent Application 61/160,652 filed Mar. 16, 2009, all of which are incorporated herein by reference in their entireties.

TECHNICAL FIELD

This disclosure relates generally to techniques for operating instrumented equipment and, more particularly, to software tools for configuring and operating such equipment.

BACKGROUND OF THE INVENTION

Scientists use scanning probe microscopes (SPMs) to reveal data about various properties of materials, such as gold or silicon, at very fine resolution, down to molecules and atoms of the materials. SPM's are a family of high magnification instruments that may include Scanning Tunneling Microscopes (STMs), Atomic Force Microscopes (AFMs), Near Field Scanning Optical Microscopes (NSOMs), among others.

SPMs typically include piezoelectric motors that move physical probes with sufficient precision to provide ultra-high resolution on the nanometer scale and below. Piezoelectric motors and actuators provide fine positioning and optionally vibrational excitation to one or more probe tips. SPM probes are of varying shapes made from both conducting and non-conducting materials all of which share the characteristic of tips that can interact mechanically and electromagnetically with atoms and surfaces with tens of picometer (10-12 m) physical precision and spatial resolution.

Current SPMs typically require many channels of sophisticated analog and digital electronic circuitry or instrumentation to deliver electrical excitations to motors, probes, surfaces and other SPM components and receive responses produced by these SPM components. These signal channels and others delivered from external electrical, optical, thermal, magnetic, chemical and mechanical components require computer based data acquisition systems. Further, the multiple channels excitation, response and control typically must be synchronized, and sometimes analyzed, in real time.

Areas of application of SPMs are expanding rapidly. New areas of materials analysis include sequencing of single strands of DNA and investigations of transport in living cells. New advanced nanomaterials are being synthesized using SPMs equipped with nanometer scale chemical deposition equipment with the target of producing thousands of nanometer scale components in a short period of time. Thus, the current SPM control systems in use today could benefit from improved operation to help meet the needs of these new applications and their predicted growth in complexity.

Another area in which SPM control systems can be improved is in connection with their user interfaces. The current generation of SPM control systems can be configured and operated using software tools that provide a graphical user interface for designing experiments. This provides a conceptually simple interface to the control system for a user since they can graphically select and connect various hardware elements represented iconically rather than by scripting or other written programming. However, such iconic user interfaces are typically constrained because the available devices that can be used in the experiments are normally limited to pre-defined modes of operation programmed into the control system. For example, a SPM control system having an FPGA will be programmed with a number of available devices that can be used in different experiment setups; however, the existing software tools used to define the experiment will generally only have certain pre-defined modes or functions for using those devices, and to add additional modes, new programming of the FPGA controller is written and compiled. This reduces the usability of the software tools since it requires interfacing with the system beyond the higher-level iconic user interface. Thus, current SPM control systems and software configuration tools used in these control systems could benefit by providing users with an iconic user interface that has increased flexibility in configuring and using the various hardware devices available in the control system. Other control systems for controlling equipment and instruments other than SPM can also benefit from these improvements which are described below.

SUMMARY OF THE INVENTION

In accordance with one aspect of the invention, there is provided a computer-implemented method of configuring programmable equipment having hardware devices that can be programmatically interconnected into different hardware configurations. The method includes the steps of:

(a) providing a first workspace on a computer display using a program that enables a user to create in the first workspace a graphical system hardware configuration that represents a desired configuration of hardware devices;

(b) providing a second workspace on a computer display using the program, wherein the program enables the user to create in the second workspace a graphical system procedure that represents a desired procedure for the desired configuration of hardware devices;

(c) automatically creating configuration data that represents the graphical system hardware configuration and the graphical system procedure; and (d) configuring the programmable equipment into the desired configuration of hardware devices to operate according to the desired procedure, wherein the configuring is carried out using the configuration data.

Other aspects of the invention include a system and computer readable medium for carrying out this process.

BRIEF DESCRIPTION OF THE DRAWINGS

Features and advantages of one or more of the disclosed embodiments of this disclosure will be apparent to those of ordinary skill in the art from the following detailed description of exemplary embodiments and the claims, with reference to the accompanying drawings in which:

FIGS. 8 and 9 together depict configuration data for the hardware and procedural configurations of FIGS. 5 and 6;

FIGS. 10 and 11 depict an exemplary xml code representation of the configuration data of FIGS. 8 and 9;

FIG. 12 depicts xml code associated with hardware devices used in the graphical system hardware configuration of FIG. 5;

FIG. 13 depicts xml code used for validation of hardware device interconnections;

DETAILED DESCRIPTION OF THE PREFERRED EMBODIMENTS

In general, an example system will be described using one or more examples of embodiments of methods of operating a system having programmable equipment that includes various hardware elements which can be programmatically interconnected in any of a number of desired configurations. The example embodiment(s) will be described with reference to use in a scanning probe microscopy system. However, it will be appreciated as the description proceeds that the invention is useful in many different systems and may be implemented in many other embodiments. In this regard, and as used herein and in the claims, it will be understood that the term system refers not only to SPM applications, but also to any other applications.

The software-based tools and methods described below can be used with various types of programmable equipment. Examples of programmable equipment include programmable logic devices (PLDs), which themselves include PALs, GALs, CPLDs, and FPGAs, along with suitable control circuitry to program, configure, and otherwise operate the devices. Other types of programmable equipment include those utilizing ASICs and other devices having interconnectable hardware elements (which are also referred to herein as hardware devices).

The illustrated embodiment includes an integrated software, firmware, and hardware environment or system that may be used for designing, configuring, and executing arbitrary predefined and programmatically variable procedures that may be strictly synchronized. The system may use varying suites or configurations of real hardware and virtual hardware or firmware. For example, the system architecture may provide for dynamic reconfigurability, extensibility, and expandability, for instance, based on implementation of a platform independent construct described below as a configuration vector, by strict timing control using a single system timing clock, by programmable, re-configurable, and dynamically partially re-configurable firmware, and/or by purpose designed mixed signal input/output hardware.

Configuration of the programmable equipment is accomplished using a software-based configuration tool (program) that permits a user to iconically design a desired hardware configuration and specify the parameters and procedures used in operating the equipment. The features of one exemplary implementation of this configuration tool will be described in greater detail below.

Figure 1:
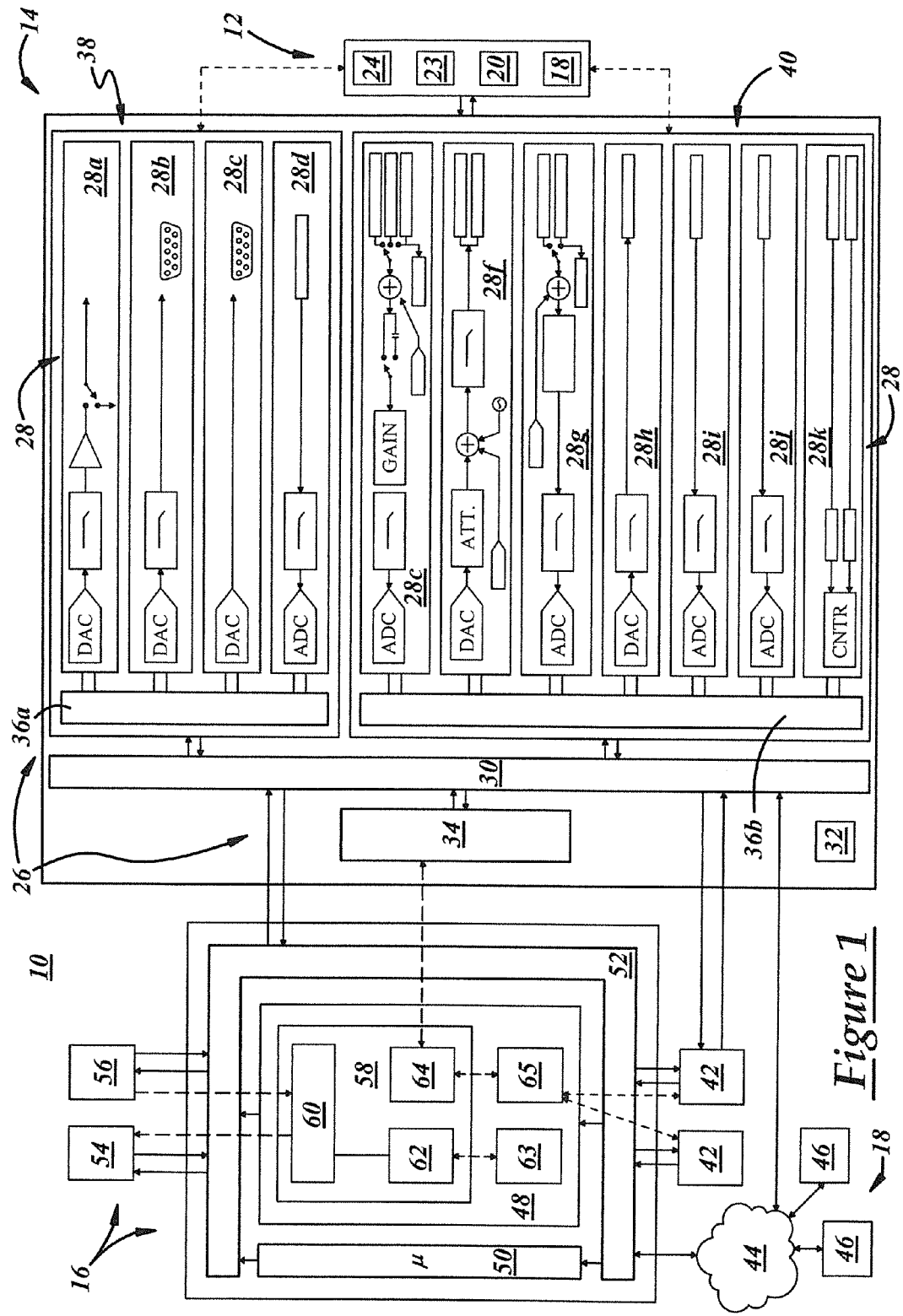
FIG. 1 is a block diagram according to a exemplary embodiment of a system which can be used to implement the invention.

Referring specifically to the drawings, FIG. 1 illustrates an exemplary embodiment of an SPM system 10, which generally may include probe equipment 12 to interact with a material of interest, programmable equipment 14 comprising, in this example, electronic instrumentation to interact with the probe equipment 12, a computer 16 to interact between the instrumentation 14 and a user, and system peripherals 18 to interact with the instrumentation 14, the computer 12, and/or the user. The SPM system 10 may include, but is not limited to AFM, STM, NSOM, or any other type of SPM system.

The probe equipment 12 may be used, for example, to experiment with a specimen under investigation, to manipulate portions of a workpiece being modified, or for any other suitable purpose. In the illustrated embodiment, the probe equipment 12 may include a base 18 to support the material of interest, and one or more probes 20 to contact the material of interest or otherwise interrogate the material of interest. The probe equipment 12 also may include one or more actuators 22 controlled by the instrumentation 14 to move the base 18 and/or the probe(s) 20, and one or more sensors 24 monitored by the instrumentation 14 to sense any suitable parameters associated with the probe(s) 20 or other elements of the probe equipment 12.

The instrumentation 14 is programmable equipment that can be used, for example, to control and monitor parameters of the SPM equipment 12. In this regard, the instrumentation 14 may be used, for example, for any detection, observation, measurement, control, computation, communication, data processing, and/or the like. The instrumentation 14 generally may include firmware-usable elements or programmable hardware 26, other instrumentation hardware 28, and a communications bus 30 in communication between the programmable hardware 26 and the computer 16. Further, the instrumentation 14 may include a single system clock 32 with a dedicated clock distribution circuit (not separately shown). The single clock 32 may enable good precision by providing exact phase synchronization of all excitation and detector reference signals. Also, use of the single clock 32 may eliminate amplification of clock jitter when clock signals are multiplied and distributed through programmable logic devices. Further, the single clock 32 may eliminate loss of phase accuracy ordinarily inherent in systems having multiple separate instrumentation units.

As used herein, the terminology system hardware may include the instrumentation 14 and one or more of the probe(s) 20, actuator(s) 22, and sensor(s) 24.

The programmable hardware 26 may include components that may be configured and programmed, either alone or in combination with the other hardware 28, to provide specific digital real time deterministic hardware components (phase locked loops, lock in detectors, signal filters, signal multipliers and adders, and etc.) and signal processing services. For example, the programmable hardware 26 may include at least one digital signal processor (DSP) 34 and one or more reconfigurable or programmable logic devices (PLDs) 36a, 36b that may be used to process digital signals according to device configurations that may be set during software program runtime.

The DSP 34 may be used to process digital signals converted from analog signals received by the instrumentation 14 from the probe equipment 12 and to process digital signals from the computer 16 and peripherals 18 for conversion to analog signals transmitted from the instrumentation 14 to the probe equipment 12.

The PLDs 36a, 36b may include, for example, field-programmable gate arrays (FPGA's), complex programmable logic devices (CPLD's), or any other suitable programmable or reconfigurable electronic devices.

The other hardware 28 may be programmable or non-programmable and may include, for example, analog and digital input and output channels, analog amplifiers, analog filters, signal combiners, power conditioners at various voltages, analog-to-digital converters (ADCs), digital-to-analog converters (DACs), channel multiplexers, pulse counting channels, and communications hardware to route various signals through the hardware and to route various signals between the programmable hardware 26 and any external or peripheral hardware.

The programmable hardware 26 and the other instrumentation hardware 28 may define one or more actuator interface modules 38 and one or more sensor interface modules 40.

For the actuator interface module 38, a first example may include one or more high voltage output paths 28a, each of which may include a DAC, a filter, a high voltage amplifier, and a ground switch to prevent transient spikes to actuators. In a second example, the actuator interface module 38 may include one or more low voltage output paths 28b to drive, for instance, piezo tubes and that may include DACs, and filters. In a third example, the actuator interface module 38 may include one or more high speed outputs 28c that may include DACs to drive any suitable actuators, for instance, columns for scanning electron microscopes. In a fourth example, the actuator interface module 38 may include one or more user defined input paths 28d, which may include BNC inputs, filters, and ADCs.

For the sensor interface module 40, a first example may include one or more high speed input paths 28e, which may be used for feedback or imaging of probe current. The high speed input paths 28e may include software controlled multiplexers and couplings for BNC and differential inputs, amplifiers, filters, and ADCs. In a second example, the module 40 may include one or more high speed output paths 28f for bias and probe drive and may include DACs, attenuators, and BNC and differential outputs. In a third example, the module 40 may include one or more user defined input paths 28g that may be used for feedback or imaging of any signal of interest to the user. The input paths 28g may include software controlled multiplexers for BNC and differential inputs, amplifiers, filters, and ADCs. In a fourth example, the module 40 may include one or more user defined output paths 28h that may be used to output any system signal or for use as secondary feedback outputs. The output paths 28h may include DACs and filters. In a fifth example, the module 40 may include one or more preamplifer signal paths 28i that may be used to measure signals from preamplifiers, for instance, associated with individual position sensing detectors. The paths 28i may include filters and ADC's. In a sixth example, the module 40 may include one or more high speed counting paths 28j that may be used to count pulses from sensors. The paths 28j may include separate logic-gate start and stop inputs and counters.

In another example, the module 40 may include one or more user defined input paths 28k for any suitable purpose. The paths 28k may include differential inputs, filters, and ADC's.

The programmable hardware 26 may be programmed to provide synchronous real time deterministic excitation and response signal controls and deterministic real time signal processing of mixed analog and digital signals received from the probe equipment 12 and any other peripheral equipment that may be connected to the hardware 28.

The system peripherals 18 may include, for example, one or more peripheral instruments 42, one or more networks 44, and one or more remote computers 46. The peripheral instruments 42 may include, for example, peripheral oscilloscopes, multimeters, or any other suitable instrumentation that a system user may desire to use, for example, to supplement the system instrumentation 14. The one or more networks 44 may include, for example, local area networks (LANs), wide area networks (WANs), or any other suitable networks. The network(s) 44 may be wired, wireless, or a combination thereof, and may be intranets, extranets, and/or global computer networks (e.g., the Internet or World Wide Web). The remote computers 46 may be any suitable devices to receive, process, store, and transmit data to and from the system computer 16. The remote computers 46 may include, for example, personal computers, servers, routers, network PCs, peer devices, other common network nodes, and/or the like, and typically include their own versions of many or all of the internal and external or peripheral elements described below relative to the computer 16. In a networked environment, software modules and/or data used by the computers 46, or portions thereof, may be stored in the remote computers 46 or remote memory storage devices associated therewith or connected thereto. By way of example, and not limitation, remote application programs/data may reside in memory of the remote computers 46.

The system computer 16 can be used to permit user configuration of the instrumentation 14 using a software tool (program) 58 that provide a graphical user interface enabling iconically-driven hardware and procedure setups, as will be described below. The system computer 16 may also be used, for example, to receive input data and instructions from a user, process the received data and instructions in light of stored data and software, and communicate output signals to the instrumentation 14 for use in operating the probe equipment 12. Conversely, in another example, the computer 16 may be used to receive input signals from the instrumentation 14, process the received input signals in light of the stored data and software, and communicate output data to the user. The computer 16 may be combined with the instrumentation 14 as an integrated product, or may be separate from the instrumentation 14.

The exemplary system computer 16 may include memory 48, one or more processors 50, one or more communications devices 52, one or more user input devices 54, and one or more user output devices 56. Of course, the computer 16 may include any ancillary devices, for example, clocks, power supplies, and the like (not separately shown). The user input devices 54 may include, for example, a pointing device (e.g., a mouse, trackball, pen, touch pad, touchscreen, joystick, or the like), keyboard, microphone, and/or the like, and may be used to enter any suitable commands or instructions and data or information into the processor(s) 50. The user output device(s) 56 may include, for example, a printer, monitor, or any other type of display device, speakers, and/or the like.

In general operation of the computer 16, the processor 50 may be powered by a power supply (not shown) and may initially operate on, for example, BIOS instructions stored in memory 48. The processor 50 receives commands or data from any input device(s) 14, 42, 46, 54, and receives, processes, and stores data or instructions from various storage media including the internal memory 48 and through any suitable memory interface, and outputs data or instructions to any output devices 14, 42, 46, 56. Generally, data processors of computers are programmed to carry out computer-executable instructions, such as those associated with or embedded in software or computer programs such as operating systems, application programs, and the like.

The communications device(s) 52 may include a bus, which may provide for data transmission internally between each of the elements in the computer 16, and externally between the internal elements of the computer 16 and any other elements external of the computer 16. The bus may include one or more of any of several types of bus structures, including a memory bus or memory controller, a peripheral bus, an accelerated graphics port, a processor or local bus and using any of a variety of bus architectures. The communications device(s) 52 may also include devices that conform to various protocols including RS-232, parallel, small computer system interface, universal serial bus, and/or any other suitable protocol(s).

The processor(s) 50 may be configured to process data and execute control logic that provides at least some of the functionality of the system 10. In this respect, the processor(s) 50 may include, for example, one or more processing units, controllers, microprocessors, micro-controllers, discrete logic circuit(s) having logic gates for implementing logic functions upon data signals, application specific integrated circuits (ASIC) with suitable logic gates, complex programmable logic devices (CPLD), programmable or field-programmable gate arrays (PGA/FPGA), any combinations of the aforementioned, and the like.

The memory 48 may include any computer readable medium or media configured to provide at least temporary storage of data and/or computer software or computer-readable instructions that provide at least some of the functionality of the system and that may be executed by the processor. The memory 48 may be in the form of removable and/or non-removable, volatile memory and/or non-volatile memory.

Exemplary volatile memory may include, for example, random access memory (RAM), static RAM (SRAM), dynamic RAM (DRAM) including synchronous or asynchronous DRAM, and/or the like, for running software and data on the processor. By way of example, and not limitation, the volatile memory may include an operating system, application programs, other memory modules, and data.

Exemplary non-volatile memory may include, for example, read only memory (ROM), erasable programmable ROM (EPROM), electrically erasable programmable ROM (EEPROM), dynamic read/write memory like magnetic or optical disks or tapes, and static read/write memory like flash memory, for storing software and data. Although not separately shown, the computer may also include other removable/non-removable volatile/non-volatile data storage or media. For example, the other media may include dynamic or static external storage read/write device(s).

The memory discussed above enable storage and communication of computer readable instructions, data structures, program modules, and other data for the computer 16. The memory 48 may store an operating system or program, application programs, and/or other program modules and program data that may reside at various times in different storage mediums associated with the computer 16.

For example, the memory 48 may store at least a portion of the graphical program 58 for operating the system 10. The graphical program 58 may include a graphical user interface (GUI) portion or layer 60, an implementation portion or layer 62 that may be in direct communication with the GUI layer 60 and one or more other application programs 63 that may be stored in the memory 48, and a hardware communications portion or layer 64 that may be in direct communication with the implementation layer 62 and with one or more peripheral hardware drivers 65 that may be stored in the memory 48. The other programs 63 may include, for example, MATLAB™ software available from The MathWorks of Natick, Mass., LABVIEW™ software available from National Instruments of Austin, Tex. The drivers 65 may include, for example, hardware drivers available from National Instruments or from any other suitable source.

The GUI layer 60 of the program 58 may include an iconic hardware description language for iconic design and instantiation of system hardware configurations and for iconic design and specification of experiments or procedures that the system 10 may implement.

Using the GUI layer 60, users may drag-and-drop intuitive icons from icon palettes to workspaces to define desired hardware configurations and procedures.

Figure 2:
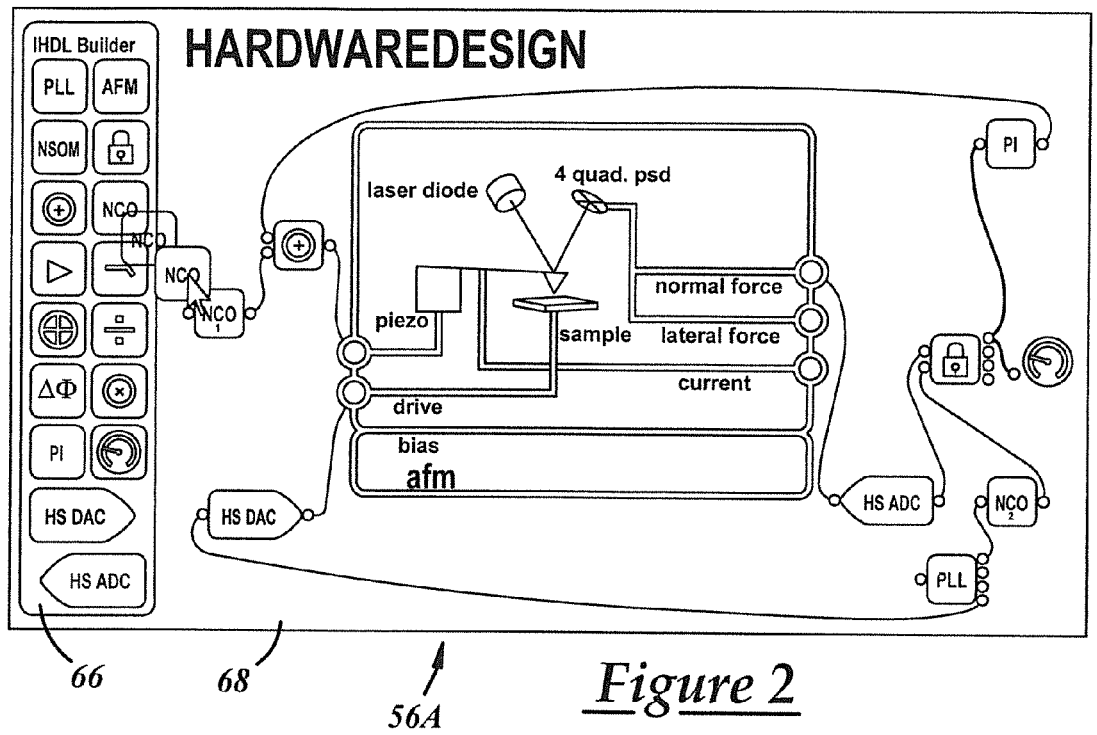
FIG. 2 is an illustration of a computer display showing a hardware workspace of a graphical user interface that can be used to design a graphical system hardware configuration using the system of FIG. 1.

In a particular example with reference to FIG. 2, the GUI layer 60 may output a graphical hardware configuration palette 66 and hardware workspace 68 to a user via a computer peripheral display 56a. The palette 66 is a graphical representation of hardware elements available for use in the system 10. The workspace 68 is provided to allow a user to instantiate graphical representations of available hardware configurations for use in the system 10. Accordingly, the palette 66 and workspace 68 may be used by a user to create a graphical system hardware configuration in the workspace 68 to specify a desired system hardware configuration.

The palette 66 may include any suitable quantity of hardware icons that may represent system hardware elements (devices) and that may be selected by a user in any suitable manner, for example, by a computer peripheral pointing device. The user may move the hardware icons from the palette 66 to the workspace 68 by selecting-dragging-dropping the icons, for example, by a mouse click-drag-drop operation or by a touchscreen touch-drag-drop operation, or the like. Each of the hardware icons in the palette 66 is associated with one or more Forth scripts or other computer programming that defines the hardware device associated with the icon, including such things as its inputs, outputs, parameters, and transfer function(s). Two or more hardware devices can be combined together in the workspace 68 and used to create a composite hardware device that can be added to the palette 66 or otherwise used as a single device. To accomplish this, the program 58 is operable to automatically combine the scripts of each device into a single, new script that provides a full definition of the composite hardware device.

The example palette 66 includes the following example icons that may be used in an SPM environment. A PLL icon represents phase-locked-loop instrumentation. An AFM icon represents atomic force microscopy probe equipment. An NSOM icon represents near-field scanning optical microscopy probe equipment. A padlock icon represents lock-in instrumentation. A + icon represents an AND gate. An NCO icon represents a numerically controlled oscillator. A filter icon represents a filter. A delta phi icon represents a phase shifter. A PI icon represents a proportional-integral controller. An HS DAC icon represents a high speed DAC, and an HS ADC represents a high speed ADC.

The example populated hardware workspace 68 represents a hardware configuration, which includes the following example elements and interrelationships between the elements for an exemplary Kelvin Force Microscopy (KFM) setup. A detailed AFM equipment graphic is displayed in the workspace 68 when the AFM icon is selected and dragged from the palette 66 to the workspace. A drive input for the AFM equipment is connected to an output of an AND gate, and an NCO and a PI controller are connected to an input of the AND gate to control probe excitation. A bias input for the AFM equipment is connected to an output of a high speed DAC. A normal force output for a probe detector of the AFM equipment is connected to an input of a high speed ADC. An output of the ADC is connected to an input of a phase-locked-loop, which has an output connected to an input of the DAC for modulation of AFM bias. The output of the ADC is also connected to an input of a lock-in, and another output of the phase-locked-loop is connected to an input of another NCO, which is also connected to the input of the lock-in. An output of the lock-in is connected to a display of the probe force and to an input of the PI controller to complete a feedback control loop to the AFM drive for contact potential difference measurement.

According to one embodiment, the GUI layer 60 will not allow a user to configure the available hardware elements in the workspace 68 in a manner that is not functionally possible. In other words, a user is prevented from connecting hardware elements that are not operable or otherwise intended by design to be connected.

Once the user populates the hardware workspace 68 with icons and interconnections between the icons to create a desired hardware configuration, the GUI layer 60 of the program produces hardware configuration data that represents the graphical system hardware configuration and is then subsequently used to configure the instrumentation 14 to implement this desired hardware configuration. An example of the configuration data is illustrated by a hardware portion of the configuration vector 70 shown in FIGS. 8 and 9, and will be discussed further below in connection with another specific example configuration.

Also, once hardware configurations are completed in the hardware workspace 68, those hardware configurations may be saved for future use, for example, as pre-configured templates that may be shared among colleagues.

Figure 3:
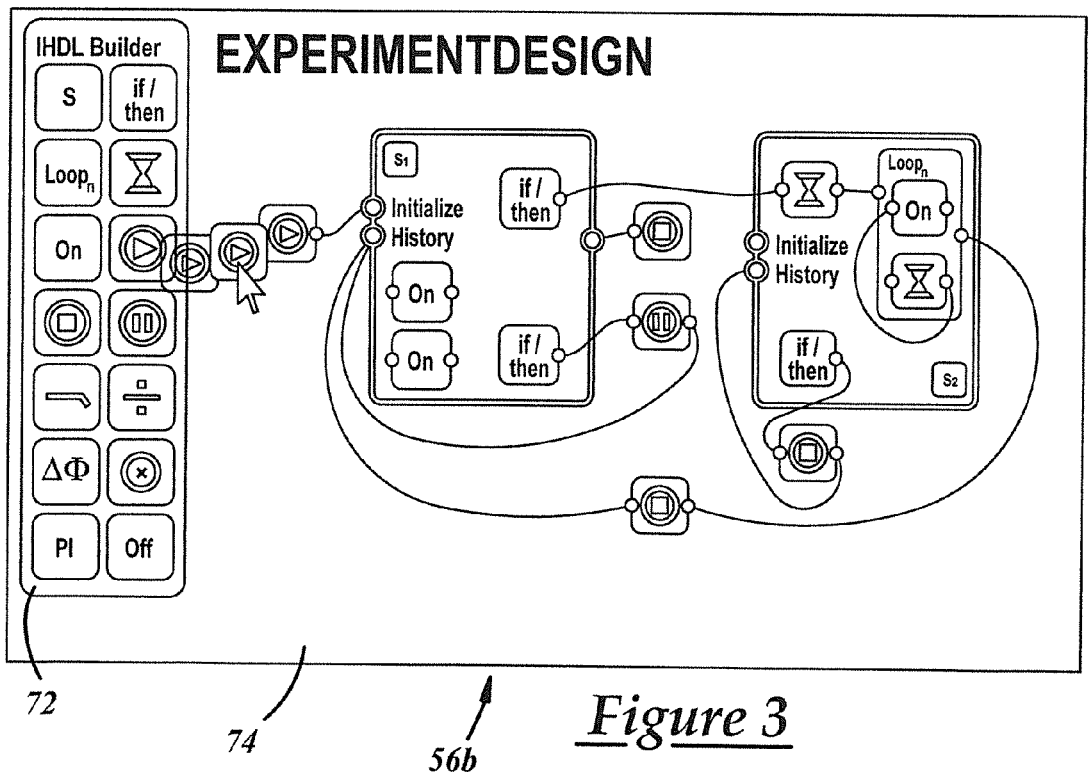
FIG. 3 is an illustration of a computer display showing a procedural workspace of a graphical user interface that can be used to design a graphical system procedure using the system of FIG. 1.

Referring to FIG. 3, the GUI layer 60 also may output an experiment or procedure palette 72 and procedural workspace 74 to a user via a computer peripheral display 56b. According to an embodiment, the GUI layer 60 may provide an interface scheme that is intended to be particularly engaging to a user, wherein the displays 56a, 56b are separate. According to one example of this engaging interface scheme, the display 56b may be a procedure window appearing on the same computer hardware monitor as a hardware window for the hardware configuration display 56a. According to this example, the windows or displays 56a, 56b are separated and may be tiled top to bottom or vertically one above the other, or may be tiled side by side or horizontally one next to the other. In another example, the displays 56a, 56b may appear on two different computer hardware monitors. According to this embodiment, the hardware and procedure workspaces 68, 74 are kept separate for aesthetic and functional reasons.

From an aesthetic perspective, presenting the procedure workspace 74 separate from the hardware workspace 68 allows an uncluttered presentation of a desired system process configuration.

From a functional perspective, the configurations defined graphically in the separate hardware and procedure workspaces 68, 74 may be changed without having to compile or recompile any program. Rather, any changes to the hardware and/or procedures contained in these workspaces 68, 74 are merely changes in hardware instructions and are processed automatically by the GUI layer and the implementation layer to modify the configuration vector 70.

The palette 72 is a graphical representation of procedure elements available for use in the system 10. The workspace 74 is provided to allow a user to instantiate graphical representations of available experiments or procedures for available hardware configurations for use in the system 10. Accordingly, the palette 72 and workspace 74 may be used by a user to create a graphical system procedure for the graphical system hardware configuration, wherein the procedure workspace 74 is separate from the hardware workspace 68, to specify a desired system procedure for the desired system hardware configuration.

The palette 72 may include any suitable quantity of procedural icons that may represent any system procedures and that may be selected by a user in any suitable manner, for example, by a computer peripheral pointing device. The user may move procedural icons from the palette 72 to the workspace 74 by selecting-and-dragging the icons, for example, by a mouse click-and-drag operation or by a touchscreen touch-and-drag operation, or the like. The procedural icons represent actions involving one or more of the hardware devices used in the graphical system hardware configuration created by the user in the hardware workspace 68. Each of the procedural icons is associated with one or more Forth scripts or other computer programming that provides instructions for carrying out the action associated with that procedural icon. Multiple procedural elements can be combined into a single, composite element that is added to the palette 72 if desired. This involves the program 58 automatically combining the programming underlying each of the combined procedural icons to form a new, single script for the composite procedural element.

The example palette 72 includes the following example icons that may be used in an SPM environment. An S icon represents a subroutine. An if/then icon represents a conditional function. A Loop$_n$ icon represents a procedure loop. An hourglass icon represents a delay function. An On icon represents an on state. A triangular "play" icon represents a procedure begin function. A rectangular "stop" icon represents a procedure end function. A "pause" icon represents a procedure pause function. A filter icon represents a filter function. A divisor icon represents a division function. A delta phi icon represents a phase shift function. An x icon represents a multiplication function. A PI icon represents a proportional-integral control function. And an Off icon represents an off state.

Although not shown, other icons may be used to represent third party procedures, for example, MATLAB™ scripts, LABVIEW™ virtual instrument functions, and the like.

The example populated procedure workspace 74 represents a procedure, which includes the following example elements and interrelationships between the elements for the exemplary Kelvin Force Microscopy (KFM) setup. A first detailed subroutine graphic is displayed in the workspace 74 when a first instance of the S icon is selected and dragged from the palette 72 to the workspace, and a second detailed subroutine graphic is displayed in the workspace 74 when a second instance of the S icon is selected and dragged from the palette 72 to the workspace. First and second instances of the On icon is added to the first subroutine, and first and second instances of the if/then icon is added to the first subroutine. A delay function, an if/then function, and a loop function are added to the second subroutine wherein an On function and a delay function are added to the loop function. A procedure begin function is added to the workspace 74 with its output connected to an initialization input of the first subroutine. Conversely, a procedure stop function is added to the workspace 74 with its input connected to an output of the first subroutine. A pause function is added to the workspace 74 with its input connected to an if/then function in the first subroutine and its output connected to a history input to the first subroutine. A delay function is added to the workspace 74 between an output of the loop of the second subroutine and the history input of the first subroutine. A pause function is added to the workspace 74 with its input connected to an output of the if/then function of the second subroutine and its output connected to a history input of the second subroutine. The other if/then function of the first subroutine is connected to an input of the delay of the second subroutine, and an output of that delay is connected to an input of the loop function. An output of the delay within the loop function is connected to an input of the On function in the loop.

The user may import and implement procedural plans created in other graphical programs, for example, LabVIEW™ and MATLABT™.

According to one embodiment, the GUI layer 60 will not allow a user to configure the available experiment or procedure elements in the workspace 74 in a manner that is not functionally possible. In other words, a user is prevented from connecting procedure elements in ways that are not operable or otherwise intended by design to be connected. Furthermore, according to one embodiment, the GUI layer 60 will automatically only allow procedures that are supported by the hardware configuration, for example an if/then procedure operating on a PI control element can not be instantiated unless a PI control element has be included in the hardware configuration. In this way the GUI layer 60 is self organizing, only those procedures and procedure controls are visible and usable when the user has the appropriate hardware instantiated. This feature aids in eliminating confusing screen menus seen in all prior art systems as they try to implement a exhaustive operating environment even when a specific user does not have or require the greatest array of hardware.

Once the user populates the procedure workspace 74 with icons and interconnections between the icons to create a desired procedure, the GUI layer 60 of the program 58 creates process configuration data that represents the graphical system procedure and that is used to configure the instrumentation 14 to carry out the desired procedure. As will be described below, this configuration data can be combined with the hardware portion of the configuration vector as a part of creating the complete configuration vector that fully represents the hardware and process configuration and consequently the desired functionality or experimental implementation specified by the user. This systems thus supports creation of combinatorically large numbers of distinct system functionality from a limited complement of real and virtual hardware components, thus enabling creation of functionality not imagined or specifically designed into the system at it original conception.

Also, once procedures are completed in the procedure workspace 74, those procedures may be saved for future use, for example, as pre-configured templates that may be shared among colleagues with compatible hardware capabilities. Accordingly, standard experiments may be created once and then selected in the future from among several stored pre-configured templates.

Figure 4:
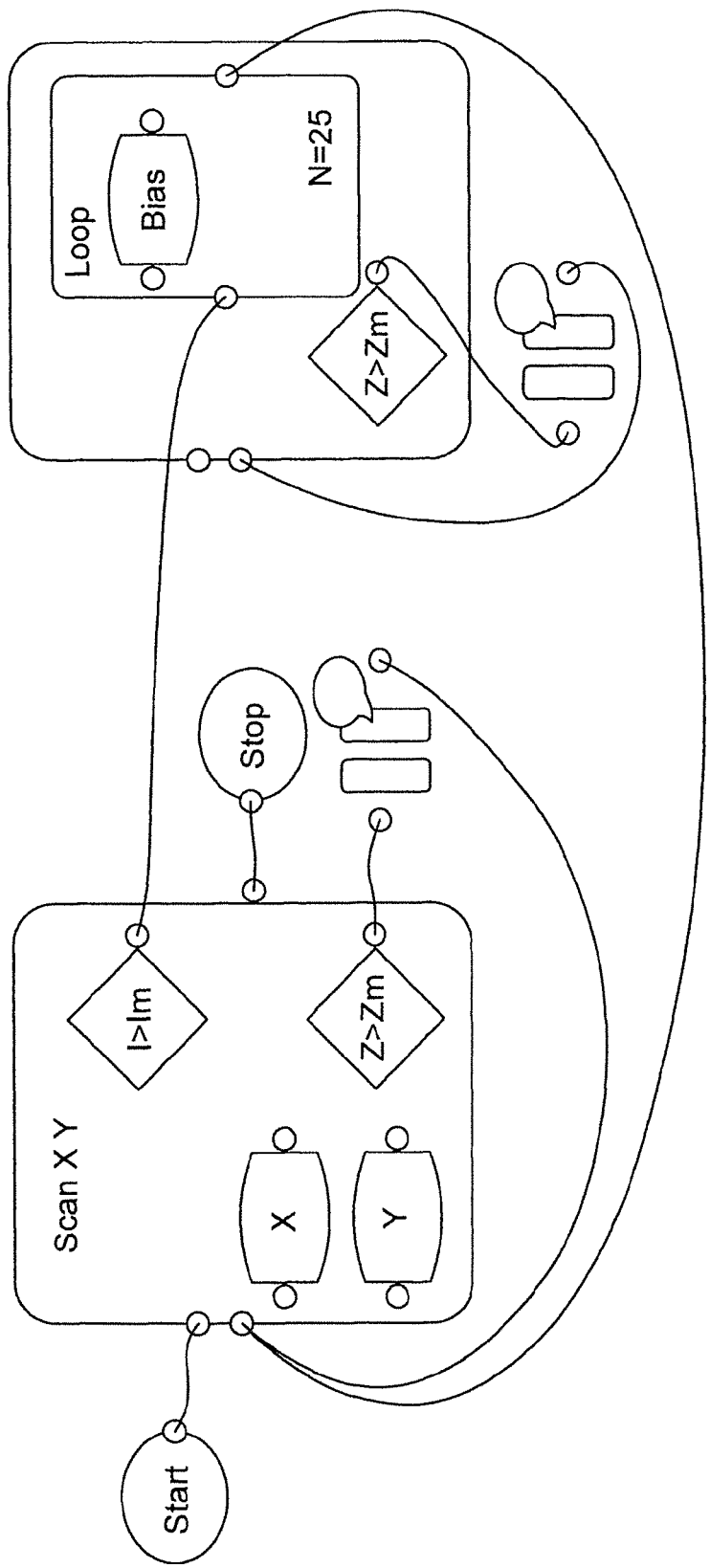
FIG. 4 is a diagram another example of a graphical system procedure for an x-y spectroscopy scan that can be configured using the procedural workspace.

FIG. 4 depicts another example of a graphical system procedure corresponding to a raster scan using the SPM equipment 12. The configuration shown provides an XY scan with spectroscopy whenever the l>lm condition is met. During the experiment, if the Z>Zm condition is met, then the experiment is paused with a message, and then resumes after the user acknowledges that message.

Figure 5:
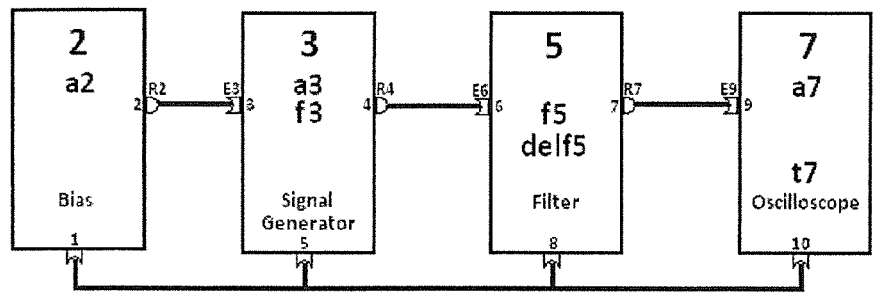
FIG. 5 is another exemplary graphical system hardware configuration that can be setup using the hardware workspace.
Figure 6:
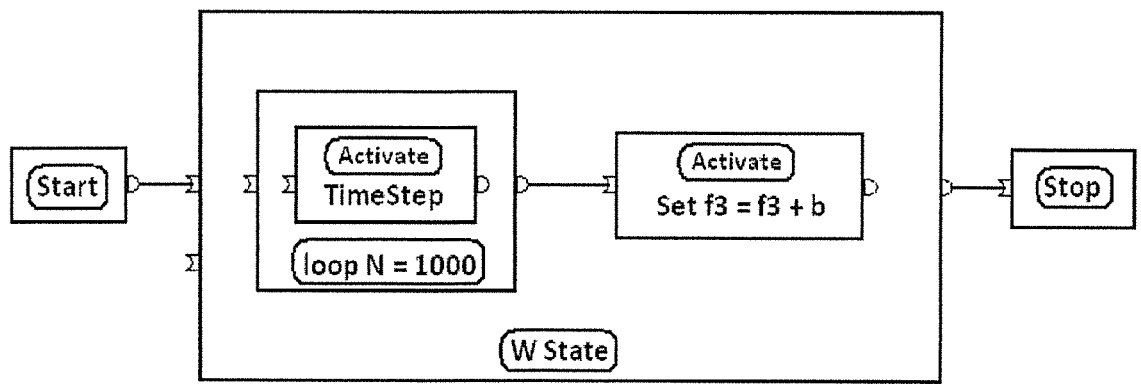
FIG. 6 depicts a graphical system procedure for the hardware configuration of FIG. 5 that can be setup using the procedural workspace.
Figure 7:
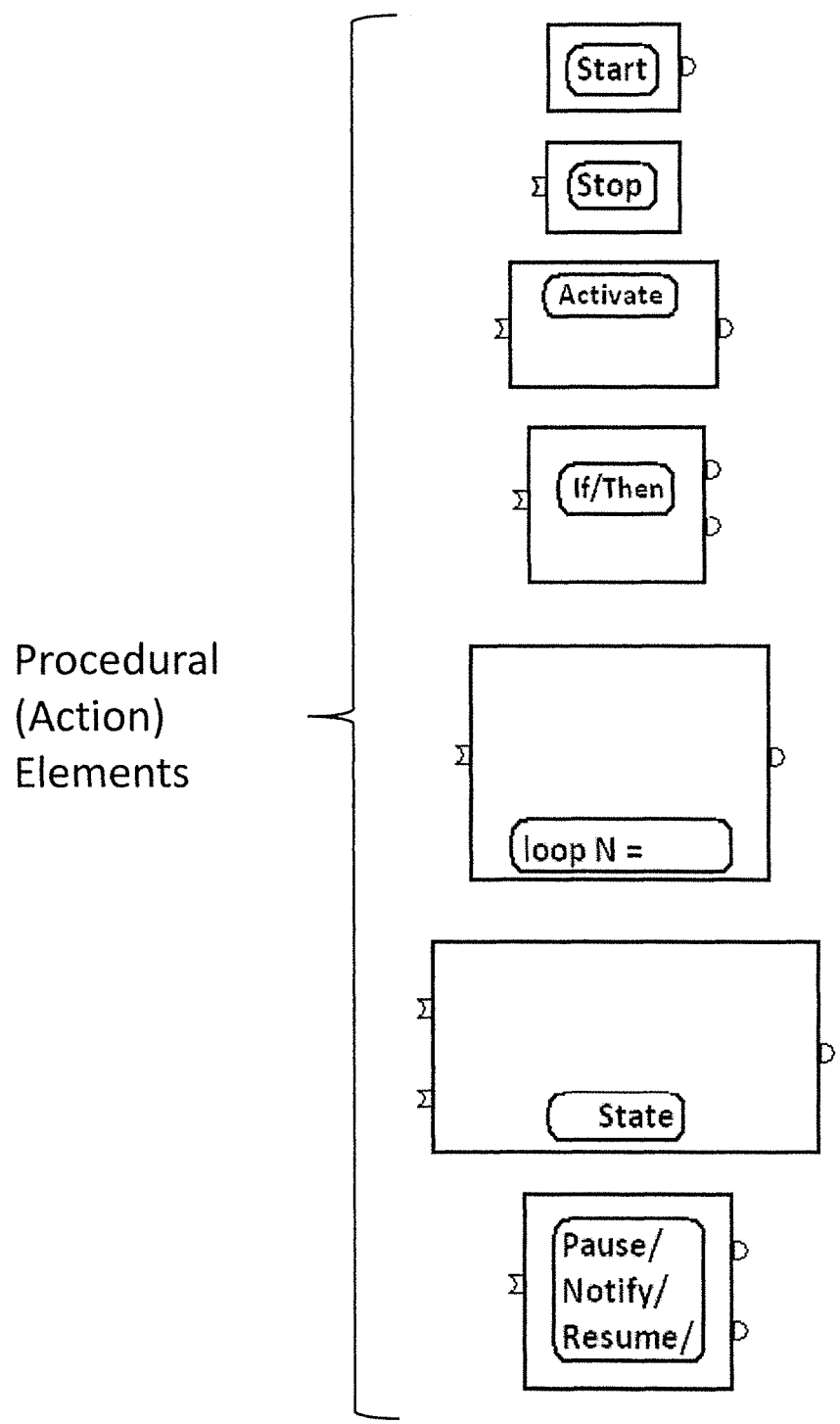
FIG. 7 shows procedural elements that can be included in a procedure palette used to define the graphical system procedure of FIG. 6.

Yet another simple example of a hardware setup and associated procedure is shown in FIGS. 5 and 6. FIG. 5 depicts the hardware setup involving four devices, numbered 2, 3, 5, and 7. This setup with the interconnections shown can be created by a user in the hardware workspace 68 using devices from the hardware palette 66. FIG. 6 depicts a graphical system procedure that has been specified for the hardware configuration of FIG. 5, and this procedure can be created by the user in the procedure workspace 74 using items from the procedure palette 72. Apart from the procedural (action) elements shown in the palette 72 of FIG. 3, the procedural elements shown in FIG. 7 can be included in the palette 72 for use in generating a graphical system procedure for the hardware configuration of FIG. 5. As shown in FIG. 6, the illustrated process involves a signal generator outputting a signal at a frequency f3 using an input bias from the bias device 2. The signal is filtered and then displayed on an oscilloscope. A counter is run during the signal generating process and, once the counter counts down from 1000, the frequency f3 is increased by the magnitude of the parameter b, and the process stops.

Figure 8:
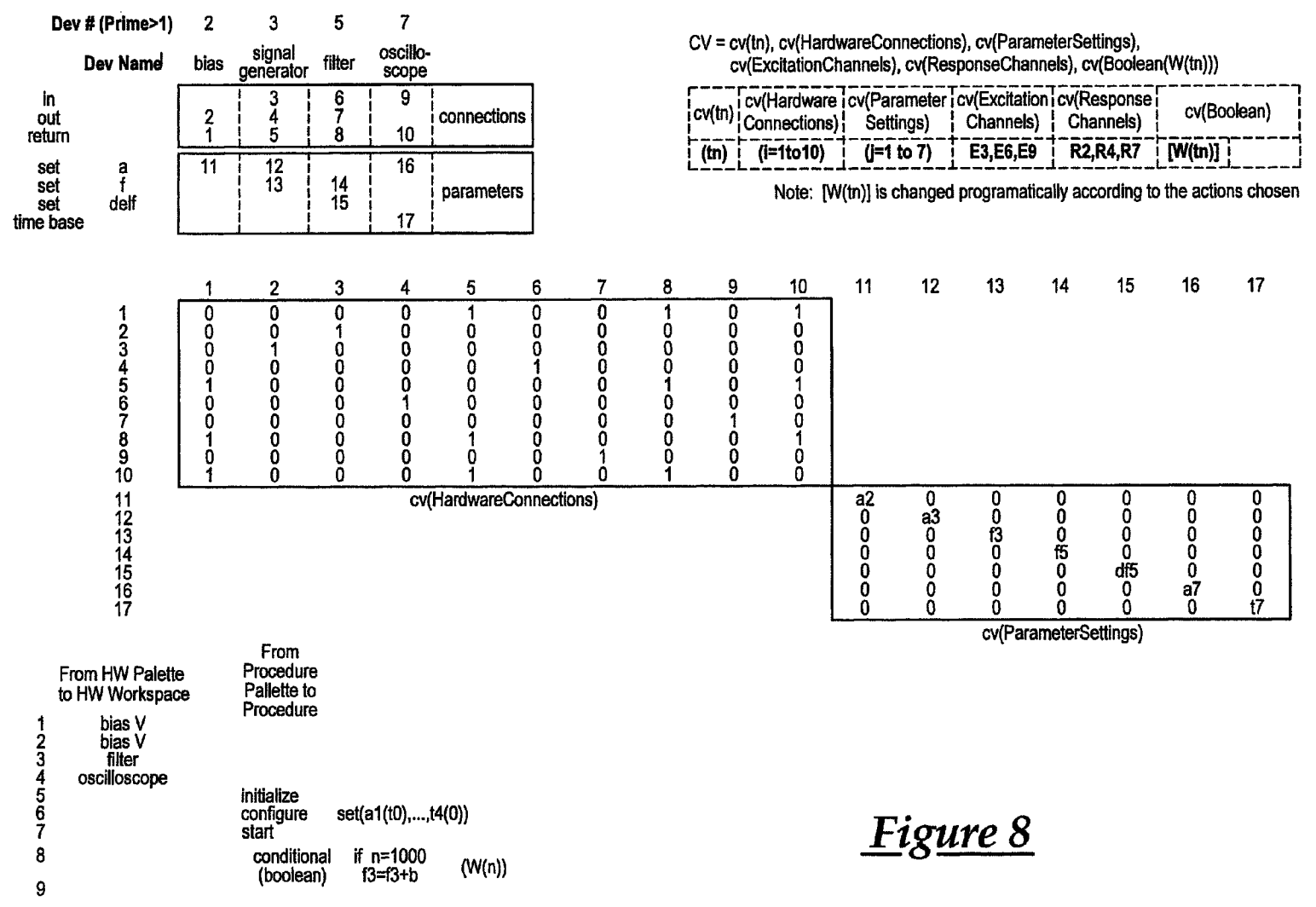

As discussed above, once the graphical system hardware configuration and graphical system procedure are setup, a configuration vector (CV) is created representing both the hardware and procedural configuration. The configuration vector can be created in parts that are later combined, such as by creating a hardware and parameter portion after the hardware setup is complete in the workspace 68, then creating a hardware based compatible procedural portion after the graphical system procedure is completed in the workspace 74, and thereafter combining the portions together to form the CV. Or, the configuration vector can be created all at once after the user is done setting up both the hardware and procedures. A sample CV 70 for the setups of FIGS. 5 and 6 is shown in FIGS. 8 and 9. The format of the representation of CV 70 shown in FIGS. 8 and 9 is for illustrative purposes only and it will be understood by those skilled in the art that a variety of different means of formatting and representing the CV 70 can be used. Furthermore, it will be understood that the use of a configuration vector format is but one means of representing the hardware and procedural configurations specified iconically by the user, and that any suitable configuration data format encoding and representing those configurations can be used by the system to automatically generate the programming/configuration of the equipment needed to carry out the desired configurations.

Configuration vector 70 comprises several portions—a hardware portion, cv(HardwareConnections), a parameter portion, cv(ParameterSettings), an excitation portion, cv(ExcitationChannels), a response portion, cv(ResponseChannels), and a procedural portion, cv(Boolean). In the drawings, FIG. 8 depicts the hardware portion and the parameter portion of the CV 70 for the configuration of FIG. 5. As shown, the hardware portion comprises a ten by ten matrix representing the interconnections of pins (inputs and outputs) for the various devices. The table at the upper left portion of the figure lists at the top the interconnections between the four devices 2, 3, 5, and 7 shown in FIG. 5. The table also includes a specification of the parameters used; for example, a bias voltage "a", a frequency f3, a filter cut-off frequency f5, and a time base t. The parameter b used to increase the frequency during operation is itself not a hardware parameter and so can be specified as a part of the procedure setup. The parameter assignments for the individual devices is specified in the parameter portion of the CV 70, and this portion comprises a seven by seven matrix.

FIG. 9 depicts the remaining portions of the CV 70—the excitation and response portions, as well as the procedural portion. As illustrated therein, the CV 70 captures the various states that occur during the procedure specified by the user. The excitations represent signal inputs to the various hardware devices, whereas the responses represent outputs of the devices, as noted by the labels E3, E6, E9, R2, R4, R7 shown in FIGS. 5 and 9. By incorporating this information into the CV 70, the complete procedural configuration is known by the program 58 and thus can be used to automatically program the instrumentation 14 without requiring user intervention. This also permits increased flexibility in the use of the various hardware devices since they can be combined and used to automatically carry out procedures that have not been predefined and yet are specified iconically so that the user need not have any programming knowledge. Further, there is never any excess information presented to the user that other systems without self organizing design features must show in order to obtain the same range of flexibility and functionality as exhibited by the illustrated embodiment.

As will be appreciated by those skilled in the art, the hardware portion of the CV does not change state-to-state so that, in FIG. 9, it would be a static configuration for each state (0 to 1004) shown. Similarly, the parameter portion does not change until state 1003 when the frequency f3 is increased by the value b.

As noted above, the configuration data used to represent the hardware and procedural configurations, whether as a configuration vector or otherwise, can take any suitable form that is usable by the system. For example, the configuration data (e.g., configuration vector 70) can be represented using a markup language, for example, xml. FIGS. 10 and 11 together depict salient portions of the CV 70 in xml. The parameter portion of CV 70 is shown at the top of that figure and it lists the four devices 2, 3, 5, and 7 along with a unique id for each device and the various parameters that can be specified. The hardware portion of CV 70 is shown at the bottom of FIG. 10 and specifies the interconnections of the devices based on their unique id numbers. FIG. 11 depicts the procedural portion of the CV 70, it being understood that only a snippet of the full xml code is shown, with some of the sections of the full set of configuration data being collapsed for ease of illustration.

As noted above, the various hardware devices and procedural (action) elements of the palettes 66 and 72, respectively, have associated code used to enable the automatic programming of the instrumentation 14. These elements also have xml-based definitions of the devices that are used when interconnecting and configuring them in the workspaces 68, 74. One example of that is shown in FIG. 12 which identifies a number of palette items for the hardware palette 68, and this further shows some of the underlying xml for one of these devices, the signal generator. A similar approach can be used to define the procedural elements of palette 72 for purposes of interconnecting and configuring those procedural elements.

The device numbers 2, 3, 5, and 7 that identify the different types of hardware elements in FIG. 5 are prime numbers that permit number representations of combinations of the hardware devices. Thus, each type of hardware device can be given a unique ID which is a prime number. This can be useful in the hardware palette 66, useful for identifying device capability and also providing feature level validation, as described below. The product of all the hardware devices in the instrumentation 14 gives out a unique number that identifies the types of hardware devices that are present in the programmable equipment as well as the number of devices. For example, if there are 2 Lockins (id 5) and 1 Signal generator (id 7), then the number identifying the programmable equipment would be 5*5*7=175. The program 58 can find the LCM (least common multiple) of this number (5,7) to determine which devices to be populated in palette 66. The program can decompose the number (GCD) to find the number of available items. This prevents the user from selecting devices not present in the programmable equipment or from selecting more of a particular device than are present. The prime number can also be used for identifying which IHLs are similar and for searching & sorting. The prime number product can also be used to check or find compatible procedures, which can be used in determining what procedural elements can be included in the procedure palette 72.

As noted above, in some embodiments, the GUI layer 60 does not allow a user to arbitrarily configure the available hardware and procedural elements in their respective workspaces. This useful restriction can be done via validation. In particular, the instrumentation 14 may have different hardware devices and multiple instances of certain devices. Feature validation involves limiting the instance count of each device according to the queried hardware capability. User level validation involves disabling the use of some hardware device or limiting the instance count of each device according to the user level. As noted above, each device can be defined by a prime number. The product of the prime number for each device and its instance provides the hardware capability. The user level will be a prime number product. This information can be encrypted using suitable means. Furthermore, the program can utilize a connection validation file that contains information specifying which outputs can connect to which inputs for each of the devices. The program 58 can retrieve the validation information stored as an xml file and validate according to it. This can also be used for showing to the user the which all connections are possible to be made. An example snippet of xml validation is shown in FIG. 13.

Figure 14:
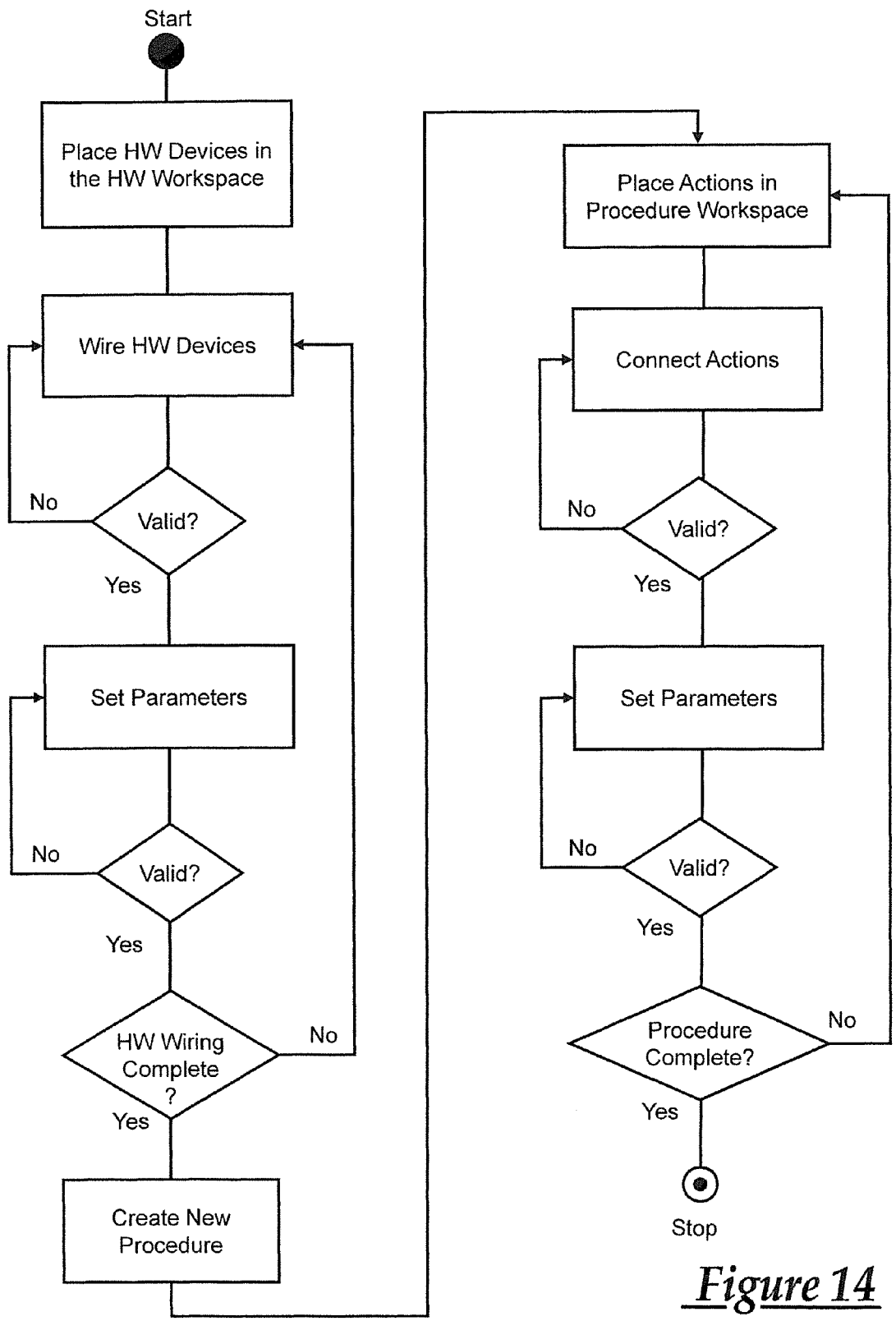
FIG. 14 is a flowchart of an exemplary embodiment of a method used to configure programmable equipment, such as that of the system of FIG. 1, using the graphical user interface and its hardware and procedural workspaces.

Thus, from the foregoing, it will be appreciated that program 58 provides a method by which a user can iconically define a hardware setup and associated procedure, and that these defined configurations can be used to automatically generate the programming necessary to configure the instrument 14 or other programmable equipment. One such method is shown in FIG. 14 wherein the user places hardware devices onto the workspace 68 from the available devices contained in the palette 66, wires them together and, if valid, sets any hardware parameters needed. Once this wiring is complete and validated, the user can switch to the procedure workspace 74, wherein procedural elements available from the palette 72 can be placed into the workspace, connected, parameters set and, if valid and complete, the configuration process ends. This validation feature is especially useful when introducing new users to complicated and often sensitive and expensive equipment functionality by minimizing the number of incorrect ways the system can be configured and used.

Various ways of permitting parameter setting can be used. In one embodiment, the program 58 provides a dashboard for this purpose, which can be implemented as a GUI window that enables the user to set configurable parameters for the hardware devices and procedural elements. The device descriptions in xml for each of the hardware and procedural elements can specify whether or not to include that element in the dashboard.

Figure 15:
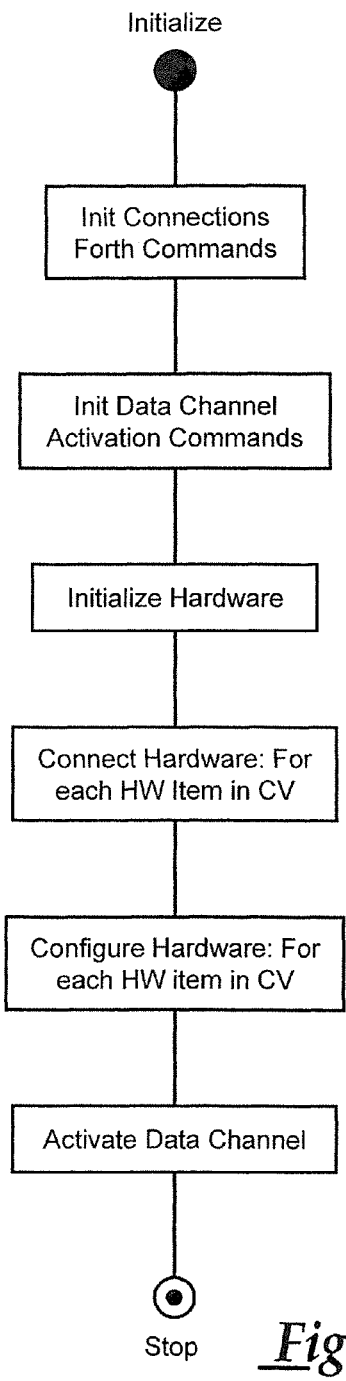
FIG. 15 is a flowchart of an exemplary embodiment of a method for automatically generating instructions for the programmable equipment to configure it according to a graphical system hardware configuration.

Once the GUI program 58 has generated the configuration data (e.g., configuration vector 70), that data can be used to automatically program/configure the instrumentation 14 so as to carry out the hardware and operational setups defined by the user. FIG. 15 depicts a method of initializing the hardware using Forth commands, although it will be appreciated that any suitable programming language can be used. Preferably, the process represented by FIG. 15 is done according to a unified modeling language (UML) such that it is programming language independent. As shown in FIG. 15, the first step is to initialize each hardware connection using Forth commands. Thus, for each hardware connection, this step obtains and adds in the Forth command required for each defined hardware connection. Then, the data channel activation commands are initialized for each data channel in the configuration vector 70. Then, the hardware is initialized which involves, for each hardware device in the CV 70, and for each output connection, obtaining the Forth connection command and sending the resulting Forth script into the instrumentation 14. Then, the hardware is configured which involves, for each hardware device in the CV 70, generating a list of Forth commands for each hardware parameter, and sending the Forth script into the instrumentation 14. Finally, the data channels are activated, and this can be done for each data channel by getting and sending an activate channel command to the instrumentation 14 for data acquisition.

Figure 16:
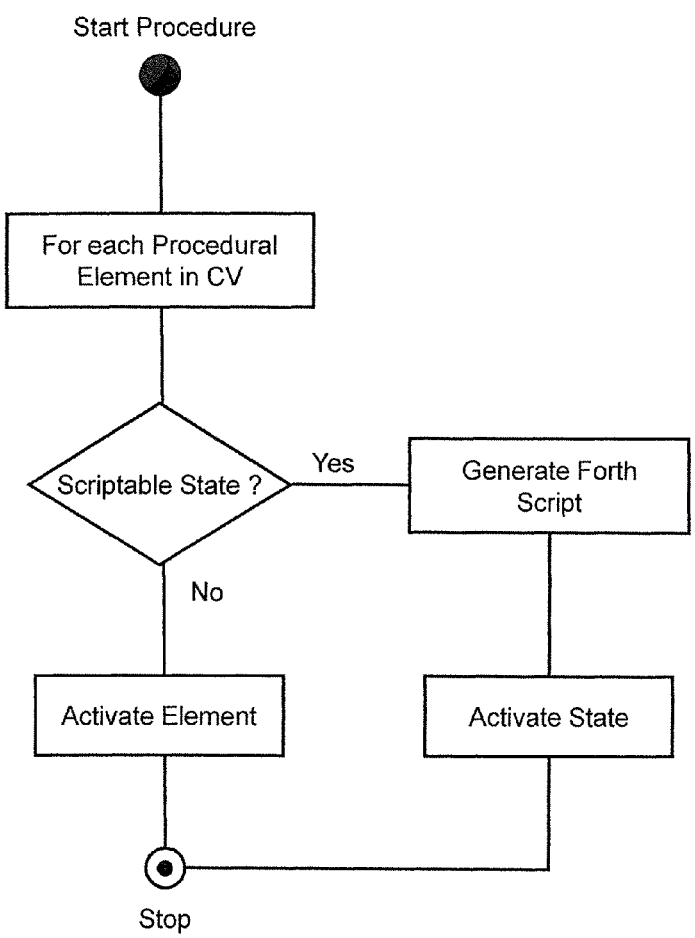
FIG. 16 is a flowchart of an exemplary embodiment of a method for automatically generating instructions for the programmable equipment to configure it according to a graphic system procedure.

Once the hardware has been initialized according to the process of FIG. 15, the procedural configuration can be generating from the CV 70 and sent to the instrumentation 14. Thus, the process of FIG. 16 can be carried out for each procedural element in the procedure portion of the CV 70. If the procedural element (item) has a scriptable state, then the program generates an interpreted command sequence for all states. That is, for each state and each element in each state, inside the state, interpret in the language being used in the connection sequence and save this interpreted command sequence into the hardware. Then, the state is activated, wherein the state item acts as a container for one or more items or other containers like loops or sub-states. The state can be conditionally paused and branched to a different state and resumed from the interrupted sequence. If the procedural element does not have a scripted state, then the element is simply activated. Thus, for each item inside the state in sequence, a list of Forth commands is generated for each activated hardware parameter and the resulting script is sent to the instrumentation 14. An activate item can be set a value or may take a finite amount of time to complete. The process then ends.

Thus, it will be appreciated that, using the configuration data, the GUI layer 60 of the program 58 may include instantiated hardware elements and hardware configuration settings in the form of icons and icon interconnections that may be displayed on a computer hardware monitor, a time sequence of actions or procedures in the form of icons and icon interconnections, and allowed sequence termination events. The GUI layer 60 also may include, for example, methods for hardware configuration and re-configuration, communications with external hardware and user instructions to alter user input, specification of input and output signal processing procedures, creation of logical tests, acquisition of real time event markers for all methods and procedures, tracking of configuration settings throughout the duration of system operation, and storage of data tensors for all elementary time intervals during execution of procedures. The GUI layer 60 will interpret this information and formulate it in ways that the implementation layer 62 can use to coordinate data transmission and receipt with the hardware communications layer 64 and/or other external application software 63.

Thus, the GUI layer 60 may present an intuitive and engaging iconic programming environment and may provide multiple visualization in real-time processing and post processing. The user may view a history of actions the user has taken and save the history as a time-ordered set of configurations.

As will be described in detail in an example below, the modified hardware configuration vector may be processed to instruct the programmable hardware to configure the system hardware in an implementation of the desired system hardware configuration and the desired system procedure.

The implementation layer 62 may obtain the configuration vector 70 from the GUI layer 60 of the program 58 and decompose it into actionable items. These various actionable items are passed to an execution manager, which then may call software components that process and implement the actionable items. For example, software components may be used for setting up data streams to and from the GUI layer 60, data processing procedures, procedures to monitor and store the instantaneous components of the configuration vector 70, prepare actionable items for communication to the programmable hardware 26 via the hardware communications layer 64, communicate with external software applications, and the like.

The implementation layer 62 also communicates with the other application programs 63, for example, to import procedural plans from MATLAB™, LABVIEW™, or the like.

The hardware communications layer 64 may handle bidirectional data transfer with the system programmable hardware 26 and hardware 28. More specifically, the hardware communications layer 64 may obtain actionable items from the implementation layer 62 and organize and convert these items into commands or instructions in a firmware language, for example, Forth. Also, the hardware communications layer 64 may manage transmission of these commands or instructions to the programmable hardware 26 and may receive, translate and direct data streams and system time clock signals arriving from the system programmable hardware 26 and hardware 28. The hardware communications layer 64 also handles bidirectional data communication to and from peripheral or remote hardware 42, 46, for example, using the hardware drivers 65.

For purposes of this disclosure, the system computer 16 may include any instrumentality or aggregation of instrumentalities operable to compute, classify, detect, display, handle, originate, manipulate, manifest, process, record, reproduce, receive, retrieve, switch, store, or utilize any form of data, information, intelligence for academic, business, production, scientific, or any other purposes. Although described in connection with an exemplary computing system environment, including a computer, the disclosed system 10 and methods may be operational with numerous other general purpose or special purpose computing system environments or configurations. The computing system environment is not intended to suggest any limitation as to the scope of use or functionality of the system or method. Moreover, the computing system environment should not be interpreted as having any dependency or requirement relating to any one component, or combination of components, illustrated in the exemplary operating environment. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, personal digital assistants, mobile telephones, network PCs, minicomputers, mainframe computers, distributed computing environments that include any of the above systems or devices, and the like.

As mentioned previously, the computer 16 may be adapted to use at least some form of computer readable media, which may include volatile and/or non-volatile media, removable and/or non-removable media, and which may be any suitable medium that may be accessed by a computer. The medium may contain, store, and/or carry instructions or programs for implementing some or all of the method steps described below in conjunction with the processor or other data processor. At least some portion of the presently disclosed methods may be practiced locally or in a distributed computing environment where tasks may be performed by remote computers or processing devices that are linked through a communications network, such as the LAN, WAN, or the like. In a distributed computing environment, program modules may be located in both local and remote computer storage media including memory storage devices.

Computer storage media may be used to distribute computer programs locally and may include volatile and non-volatile, removable and non-removable media implemented in any method or technology for storage of information such as computer readable instructions, program modules, data structures, other data, and the like. More specifically, computer storage media may include RAM, ROM, EEPROM, flash memory or memory sticks, integrated circuits, CD-ROM, digital versatile disks (DVD) or other optical disk storage, magnetic cassettes, magnetic tape, magnetic disk storage or other magnetic storage devices, or any other medium that may be used to store the desired information and that may be accessed by the computer 16.

The methods described above may be performed as one or more computer programs and the various data may be stored in the memory 48 as a look-up table or the like. Computer programs or software may include executable instructions for implementing logical functions and can be embodied in any computer-readable medium for use by or in connection with a processor that can retrieve and execute the instructions. The software may include, but is not limited to routines, modules, objects, components, data structures, and the like, for performing particular tasks and/or implementing particular abstract data types. Computer programs may exist in a variety of forms both active and inactive. General examples include software programs comprised of instructions in source code, object code, executable code or other formats; firmware programs; or hardware description language (HDL) files; and the like. Specific examples include assembler, C, C++ objects, Visual Basic, Visual C++, XML, UML, Java, and Microsoft® Foundation Classes, Microsoft.net, visual.net, PERL, PHP, SQL, and the like. Any of the above can be embodied on a computer usable medium, which include one or more storage devices and/or signals, in compressed or uncompressed form. Exemplary computer usable storage devices include conventional computer system RAM (random access memory), ROM (read only memory), EPROM (erasable, programmable ROM), EEPROM (electrically erasable, programmable ROM), and magnetic or optical disks or tapes.

One or more of the features of the exemplary embodiments described above, may provide one or more of the following benefits.

The system 10 can be used to turn on, safely initialize all internal states and report its current status and the status of connected remote hardware through the GUI layer 60.

The system 10 can be used to save all configurations and signal data. A user may retrieve the saved configurations and all signal channels and analyze, process, view and save processed results.

Analysis and processing may occur during data acquisition, with sequential updates using common tools for display/analysis/processing for live or stored data.

The system 10 may control single and multiple SPM type devices that can control motion and implement topographical type microscopic determinations with 10's of picometer control and resolution in the image plane; and with independent control of motion and position (including average speed and imposed high frequency speed and position modulations) in the direction perpendicular to the image plane with 10's of picometer position control and resolution. The system 10 may implement multiple types of localized electromagnetic and/or physical excitations to a specimen with 100's of picometer in plane spatial resolution and precision. The system 10 may implement placement, movement and chemical/physical processing of non-reactive and reactive species on multiple types of substrates with 10's of picometer location precision and repeatability in all three spatial dimensions.

Surprisingly, these software based services may become meaningful and implementable through two system artifacts; the single system wide time clock 32 and the configuration vector 70. The single system wide time clock 32 allows for strict time ordering and synchronization between all events the system 10 traverses. Entries in the configuration vector 70 are values assigned in a systematic way to capture the details of all instantiated hardware, all excitation and response signals, and the algorithms determining the evolution of the system 10 through time and the programmatic modification of these algorithms in response to changes in external conditions.

The foregoing description is not a definition of the invention, but is a description of one or more examples of exemplary embodiments of the invention. The statements contained in the foregoing description relate to the particular examples and are not to be construed as limitations on the scope of the invention as claimed below or on the definition of terminology used in the claims, except where terminology is expressly defined above. And although the present invention has been disclosed using a limited number of examples, many other examples are possible and it is not intended herein to mention all of the possible manifestations of the invention. In fact, other modifications, variations, forms, ramifications, substitutions, and/or equivalents will become apparent to those skilled in the art in view of the foregoing description. The present invention is intended to embrace such forms, ramifications, modifications, variations, substitutions, and/or equivalents as fall within the spirit and broad scope of the following claims. In other words, the present invention encompasses many substitutions or equivalents of limitations recited in the following claims. Therefore, the invention is not limited to the particular examples of exemplary embodiments disclosed herein but instead is defined solely by the claims below.

The invention claimed is:

1. A computer-implemented method of configuring programmable equipment having hardware devices that can be programmatically interconnected into different hardware configurations that provide excitation and response signal controls for probe equipment of a scanning probe microscope (SPM), comprising the steps of:

(a) providing a hardware workspace on a computer display using a program that enables a user to create in the hardware workspace a graphical system hardware configuration that represents a desired configuration of hardware devices, and providing a plurality of hardware icons on the computer display in a hardware device palette positioned adjacent to the hardware workspace, wherein the program enables the user to move the hardware icons from the hardware device palette to the hardware workspace and interconnect the hardware icons into the graphical system hardware configuration;

(b) providing a procedure workspace separate from the hardware workspace on a computer display using the program, wherein the program enables the user to create in the procedure workspace a graphical system procedure that represents a desired procedure for the desired configuration of hardware devices, and providing a plurality of procedural icons on the computer display in a procedure palette positioned adjacent to the procedure workspace, wherein the procedural icons represent actions involving one or more of the hardware devices from the graphical system hardware configuration, and wherein the program enables the user to move the procedural icons from the procedure palette to the procedure workspace and interconnect the procedural icons into the graphical system procedure;

(c) automatically creating configuration data that represents the graphical system hardware configuration and the graphical system procedure, including:

creating a configuration vector having a hardware portion, a parameter portion, an excitation portion, a response portion, and a procedure portion, creating the hardware portion of the configuration vector that identifies each of the hardware devices in the graphical system hardware configuration and that specifies the interconnections of the identified hardware devices, validating the hardware interconnections using a connection validation file that contains information specifying output and input connections for each of the hardware devices, and, once the validating is complete, then creating the procedure portion of the configuration vector that represents the graphical system procedure by specifying actions associated with operation of the hardware devices in the graphical system hardware configuration, wherein the hardware and procedural icons are not arbitrarily configurable in their respective workspaces such that the hardware icons in the hardware workspace are not configurable in a manner that is not intended by design and the procedural icons in the procedure workspace are not configurable in a manner that is not functionally possible, such that only those procedures that are functionally possible are visible and usable for the hardware instantiated in the hardware workspace; and (d) configuring the programmable equipment into the desired configuration of hardware devices to operate according to the desired procedure, wherein the configuring is carried out using the configuration data.

2. The method of claim 1 wherein the step of creating the configuration vector further comprises representing the configuration vector using a markup language.

3. The method of claim 1, wherein step (d) further comprises automatically generating programming instructions based on the configuration data and configuring the programmable equipment based on the programming instructions.

4. The method of claim 3, wherein the programmable equipment includes an FPGA having the hardware devices programmed into the FPGA, and wherein step (d) further comprises using a controller to configure the FPGA into the desired configuration of hardware devices and to operate according to the desired procedure.

5. The method of claim 1, wherein step (d) further comprises the steps of:

decomposing the configuration data into actionable items;

passing the actionable items to an execution manager that calls software components to process the actionable items;

converting the actionable items into firmware instructions; and communicating the firmware instructions to the programmable equipment.

6. The method of claim 1, wherein the step of providing a plurality of procedural icons further comprises providing, for each of at least some of the procedural icons, computer programming that is associated with that procedural icon and that provides instructions for carrying out the action associated with that procedural icon.

7. The method of claim 6, wherein the computer programming comprises a scripting language.

8. A computer program product comprising a non-transitory computer readable medium including instructions executable by a computer-controlled system that includes programmable equipment having hardware devices that can be programmatically interconnected into different hardware configurations, wherein the instructions are stored on the computer readable medium and are operable upon execution by the computer-controlled system to cause the system to carry out the steps recited in claim 1.

9. A computer program product as defined in claim 8, wherein the instructions stored on the computer readable medium are operable upon execution by the computer-controlled system to create the configuration data.

10. A computer program product as defined in claim 8, wherein the instructions stored on the computer readable medium are operable upon execution by the computer-controlled system to carry out the configuring step using the steps of:

decomposing the configuration vectors into actionable items;

passing the actionable items to an execution manager that calls software components to process the actionable items;

converting the actionable items into firmware instructions; and communicating the firmware instructions to the programmable equipment.

11. A computer program product as defined in claim 8 wherein the procedural icons represent actions involving one or more of the hardware devices from the graphical system hardware configuration, and wherein the instructions stored on the computer readable medium include, for each of at least some of the procedural icons, computer programming that is associated with that procedural icon and that provides instructions for carrying out the action associated with that procedural icon.

12. The method as defined in claim 1, wherein the configurations defined graphically in the hardware and procedure workspaces are changeable without having to compile or recompile any program.

13. The method as defined in claim 1, wherein the hardware devices each have a unique identification including a prime number, which is usable to prevent a user from selecting hardware devices not present or from selecting more of a particular hardware device than are present, wherein a product of the prime numbers of the hardware devices establishes a unique number that identifies the types and quantity of hardware devices.

14. A computer-controlled scanning probe microscope (SPM) system, comprising:
- SPM equipment to carry out a process and including one or more SPM probes, one or more SPM actuators, and one or more SPM sensors;
- instrumentation coupled to the SPM equipment to transmit excitations to the equipment and receive responses produced by the equipment and including programmable hardware to provide digital components including phase locked loops and lock in detectors and including at least one digital signal processor (DSP) and one or more programmable logic devices (PLDs) to process digital signals according to hardware device configurations settable during software program runtime;
- one or more actuator interface modules including:
  - one or more high voltage output paths including DACs, filters, high voltage amplifiers, and ground switches; and
  - one or more low voltage output paths including DACs, and filters; and
- one or more sensor interface modules including:
  - one or more high speed input paths with software controlled multiplexers and couplings for BNC and differential inputs, amplifiers, filters, and ADCs; and
  - one or more high speed output paths with DACs, attenuators, and BNC and differential outputs; and
- a computer coupled to the instrumentation and including:
  - at least one input device to receive instructions from a user;
  - at least one output device to present information to the user;
  - a memory storing program instructions and data;
  - a processor coupled to the input and output devices and memory and responsive to program instructions to cause the computer-controlled system to perform the steps of claim 1.

15. The system as defined in claim 14, wherein the instrumentation includes a single system wide clock that synchronizes phase of excitation and response signals.

16. The system as defined in claim 14, wherein the equipment is a scanning probe microscope.

17. The system as defined in claim 14, wherein the instrumentation includes programmable hardware including at least one digital signal processor, one or more programmable logic devices, one or more probe actuators, and one or more probe sensors.

18. A computer-implemented method of configuring programmable equipment having hardware devices that can be programmatically interconnected into different hardware configurations that provide excitation and response signal controls for probe equipment of a scanning probe microscope (SPM), comprising the steps of:
(a) providing a hardware workspace on a computer display using a program that enables a user to create in the hardware workspace a graphical system hardware configuration that represents a desired configuration of hardware devices, and providing a plurality of hardware icons on the computer display in a hardware device palette, wherein the program enables the user to move the hardware icons from the hardware device palette to the hardware workspace and interconnect the hardware icons into the graphical system hardware configuration;
(b) providing a procedure workspace separate from the hardware workspace on a computer display using the program, wherein the program enables the user to create in the procedure workspace a graphical system procedure that represents a desired procedure for the desired configuration of hardware devices, and providing a plurality of procedural icons on the computer display in a procedure palette, wherein the procedural icons represent actions involving one or more of the hardware devices from the graphical system hardware configuration, and wherein the program enables the user to move the procedural icons from the procedure palette to the procedure workspace and interconnect the procedural icons into the graphical system procedure;
(c) automatically creating configuration data that represents the graphical system hardware configuration and the graphical system procedure, including:
  - validating hardware interconnections using a connection validation file that contains information specifying output and input connections for each of the hardware devices,
  - wherein the hardware and procedural icons are not arbitrarily configurable in their respective workspaces such that the hardware icons in the hardware workspace are not configurable in a manner that is not intended by design and the procedural icons in the procedure workspace are not configurable in a manner that is not functionally possible, such that only those procedures that are functionally possible are visible and usable for the hardware instantiated in the hardware workspace; and
(d) configuring the programmable equipment into the desired configuration of hardware devices to operate according to the desired procedure, wherein the configuring is carried out using the configuration data.

19. The method of claim 18, wherein step (c) further comprises:
- creating a configuration vector having a hardware portion, a parameter portion, an excitation portion, a response portion, and a procedure portion;
- creating the hardware portion of the configuration vector that identifies each of the hardware devices in the graphical system hardware configuration and that specifies the interconnections of the identified hardware devices; and
- creating the procedure portion of the configuration vector that represents the graphical system procedure by specifying actions associated with operation of the hardware devices in the graphical system hardware configuration.

20. The method of claim 18, wherein the hardware device palette is positioned adjacent to the hardware workspace, and the procedure palette is positioned adjacent to the procedure workspace.

* * * * *